(12) United States Patent
Tsai et al.

(10) Patent No.: US 9,426,891 B2
(45) Date of Patent: Aug. 23, 2016

(54) CIRCUIT BOARD WITH EMBEDDED PASSIVE COMPONENT AND MANUFACTURING METHOD THEREOF

(71) Applicant: Advanced Semiconductor Engineering, Inc., Kaohsiung (TW)

(72) Inventors: Li-Chuan Tsai, Kaohsiung (TW); Chih-Cheng Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 14/550,615

(22) Filed: Nov. 21, 2014

(65) Prior Publication Data

US 2016/0150651 A1 May 26, 2016

(51) Int. Cl.
| | |
|---|---|
| *H01L 23/52* | (2006.01) |
| *H05K 1/18* | (2006.01) |
| *H01L 21/48* | (2006.01) |
| *H01L 23/498* | (2006.01) |
| *H05K 3/34* | (2006.01) |
| *H05K 3/00* | (2006.01) |

(52) U.S. Cl.
CPC .............. *H05K 1/186* (2013.01); *H01L 21/486* (2013.01); *H01L 21/4857* (2013.01); *H01L 23/49822* (2013.01); *H01L 23/49827* (2013.01); *H01L 23/49838* (2013.01); *H05K 3/007* (2013.01); *H05K 3/34* (2013.01); *H05K 2203/06* (2013.01)

(58) Field of Classification Search
CPC .................... H01L 23/48922; H01L 23/49838; H01L 21/4857; H01L 21/486
See application file for complete search history.

(56) References Cited

U.S. PATENT DOCUMENTS

| | | | |
|---|---|---|---|
| 5,250,843 A | 10/1993 | Eichelberger | |
| 6,423,570 B1 | 7/2002 | Ma et al. | |
| 6,680,529 B2 | 1/2004 | Chen et al. | |
| 6,909,054 B2 | 6/2005 | Sakamoto et al. | |
| 6,914,322 B2 | 7/2005 | Iijima et al. | |
| 7,285,862 B2 | 10/2007 | Sunohara et al. | |
| 7,498,200 B2 | 3/2009 | Sunohara et al. | |
| 7,663,215 B2 | 2/2010 | Tuominen et al. | |
| 7,732,712 B2 | 6/2010 | Yamano | |
| 2009/0073667 A1* | 3/2009 | Chung | H01L 23/3114 361/763 |
| 2009/0215231 A1 | 8/2009 | Inoue | |
| 2010/0078205 A1* | 4/2010 | Sakai | H01L 23/5389 174/260 |
| 2015/0145145 A1* | 5/2015 | Tsuyutani | H01L 23/3121 257/774 |
| 2015/0282314 A1* | 10/2015 | Furuta | H05K 1/11 174/257 |

* cited by examiner

*Primary Examiner* — Jerome Jackson, Jr.
*Assistant Examiner* — Wasiul Haider
(74) *Attorney, Agent, or Firm* — Foley & Lardner LLP; Cliff Z. Liu; Angela D. Murch

(57) ABSTRACT

The present disclosure relates to a semiconductor device substrate and a method for making the same. The semiconductor device substrate includes a first dielectric layer, a second dielectric layer and an electronic component. The first dielectric layer includes a body portion, and a wall portion protruded from a first surface of the body portion. The wall portion has an end. The second dielectric layer has a first surface and an opposing second surface. The first surface of the second dielectric layer is adjacent to the first surface of the body portion. The second dielectric layer surrounds the wall portion. The end of the wall portion extends beyond the second surface of the second dielectric layer. The electronic component includes a first electrical contact and a second electrical contact. At least a part of the electronic component is surrounded by the wall portion.

20 Claims, 17 Drawing Sheets

CIRCUIT BOARD WITH EMBEDDED PASSIVE COMPONENT AND MANUFACTURING METHOD THEREOF

BACKGROUND

1. Technical Field

The present disclosure relates to a circuit board and a manufacturing method thereof, and more particularly to a circuit board with embedded passive component and a manufacturing method thereof.

2. Description of the Related Art

Semiconductor devices have become progressively more complex, driven at least in part by the demand for smaller sizes and enhanced processing speeds. At the same time, there is a demand to further miniaturize many electronic products containing these semiconductor devices. Semiconductor devices are typically packaged, and then may be installed on a substrate that includes electrical circuitry, such as a circuit board. This results in space being occupied by both the semiconductor device package and the substrate, with surface area on the substrate being occupied by the semiconductor device package. Additional costs may be incurred by performing packaging, board manufacturing, and assembly as separate processes. It would be desirable to reduce the space occupied by the semiconductor device on the substrate, and to simplify and combine the packaging, board manufacturing, and assembly processes as applied to the semiconductor device and the substrate.

SUMMARY

In accordance with an embodiment of the present disclosure, a semiconductor device substrate includes a first dielectric layer, a second dielectric layer and an electronic component. The first dielectric layer includes a body portion, and a wall portion protruded from a first surface of the body portion. The wall portion has an end. The second dielectric layer has a first surface and an opposing second surface. The first surface of the second dielectric layer is adjacent to the first surface of the body portion. The second dielectric layer surrounds the wall portion. The end of the wall portion extends beyond the second surface of the second dielectric layer. The electronic component includes a first electrical contact and a second electrical contact. At least a part of the electronic component is surrounded by the wall portion.

In accordance with an embodiment of the present disclosure, a method of making a semiconductor device substrate includes: (a) providing a first dielectric layer, a first patterned conductive layer, and a metal layer, the first dielectric layer having a first surface and an opposing second surface, the first patterned conductive layer disposed on the first surface, and the metal layer disposed on the second surface; (b) removing a part of the first dielectric layer and a part of the metal layer to form an accommodation space; (c) attaching a support member to the metal layer; (d) placing an electronic component in the accommodation space and on the support member; (e) laminating a second dielectric layer to the first surface of the first dielectric layer to envelop the electronic component; and (f) removing the support member from the metal layer subsequent to the lamination of (e) to expose the electronic component.

In accordance with an embodiment of the present disclosure, a circuit board includes a base layer, a component, an insulating layer, a first patterned conductive layer and a conductor. The base layer has a first surface and an opposing second surface. The base layer defines an opening from the first surface to the second surface. The component is disposed within the opening defined by the base layer. The component fills a portion of the opening such that a gap is defined between the component and the base layer. The component includes an electrical contact. The insulating layer is disposed on the first surface of the base layer and includes a wall portion filling the gap defined between the component and the base layer. The first patterned conductive layer is disposed within the base layer and is exposed from the second surface of the base layer. The conductor is disposed on the the electrical contact and on the first patterned conductive layer. The conductor forms an electrical connection between the electrical contact and the first patterned conductive layer.

DETAILED DESCRIPTION

Various substrates having semiconductor devices embedded, so-called chip-embedded substrates, have been proposed, wherein an electronic device is first buried in a substrate and then a rerouting structure is fabricated in subsequent processes. The rerouting structure may include a redistribution layer (RDL) and interconnects (e.g., conducting posts) extending from the RDL and terminating as contact structures at the surface of a thick support layer, for the next level packaging structure. The RDL may be supported by the passivation layer formed over the embedded semiconductor device. A polymeric layer may be deposited over the RDL, and etched or drilled to provide a via for over-filling with a metal to form an interconnect (i.e., a conducting post) that extends above and beyond the opening of the via. A solder bump attached to the protruding end of the post may be formed by electroless plating, screen or stencil printing.

The top surface of the passivation layer may not be smooth due to electrical contacts of the embedded electronic device extending beyond the surface of the electronic device; in this case, high-resolution lithography is not effective to form the vias and RDL. Consequently, the pitch of the RDL is limited. Moreover, failure of the formation of the RDL may lead to loss of a packaged substrate, including loss of a relatively high cost electronic device buried in the packaged substrate. Described in this disclosure is a device substrate which provides for better formation of vias and RDL, and therefore reduced manufacturing losses.

Figure 1A:
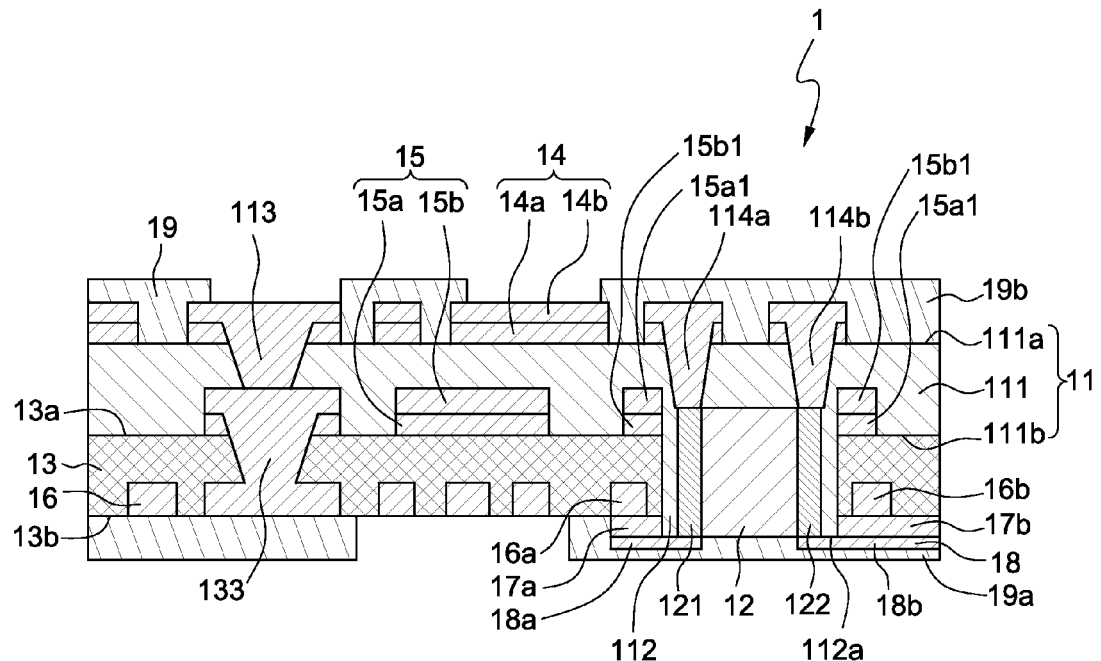
FIG. 1A is a cross-sectional view of a circuit board in accordance with an embodiment of the present disclosure.

FIG. 1A is a cross-sectional view of a circuit board in accordance with an embodiment of the present disclosure. The circuit board 1 may include an insulating layer (e.g., a first dielectric layer 11), an electronic component 12, a base layer (e.g., a second dielectric layer 13), a number of patterned conductive layers 14, 15, 16, 17 (indicated by identifiers 17a and 17b) and 18, and solder resist layers 19a and 19b. The term 'thickness' is used to describe a dimension in the vertical direction in the context of the individual figures unless otherwise noted.

The first dielectric layer 11 includes a body portion 111 and a wall portion 112. The body portion 111 has an upper surface 111a and a lower surface 111b opposite to the upper surface 111a. The wall portion 112 protrudes from the lower surface 111b of the body portion 111. The wall portion 112 has an end 112a opposite the lower surface 111b of the body portion 111. The first dielectric layer 11 may include but is not limited to pre-impregnated composite fibers (Pre-preg/P.P.). Examples of pre-preg may include, but are not limited to, a multi-layer structure formed by stacking or laminating a number of pre-impregnated materials/sheets. The body portion 111 may have a thickness (i.e., from the upper surface 111a to the lower surface 111b) from approximately 20 micrometers (μm) to approximately 100 μm. The wall portion 112 may have a thickness (i.e., from the lower surface 111b of the body portion 111 to the end 112a) from approximately 50 μm to approximately 115 μm. The wall portion 112 may have a width (i.e., a lateral or horizontal dimension) from approximately 20 μm to approximately 200 μm.

The second dielectric layer 13 has an upper surface 13a and an opposing lower surface 13b. The upper surface 13a of the second dielectric layer 13 is adjacent to, and may be bonded to, the lower surface 111b of the body portion 111. The second dielectric layer 13 may surround the wall portion 112. The end 112a of the wall portion 112 may extend beyond the lower surface 13b of the second dielectric layer 13. The second dielectric layer 13 may include material(s) the same as or different from that of the first dielectric layer 11. The second dielectric layer 13 may have a thickness (i.e., from the upper surface 13a to the lower surface 13b) from approximately 50 μm to approximately 110 μm.

The electronic component 12 may have a first electrical contact 121 and a second electrical contact 122. The length of one or both of the first electrical contact 121 and the second electrical contact 122 is from approximately 90 μm to approximately 110 μm, where the term length as related to the first electrical contact 121 and the second electrical contact 122 indicates a vertical dimension in the context of FIG. 1A. For example, a part of the electronic component 12 is surrounded by the wall portion 112. A part of the electronic component 12 is surrounded by the wall portion 112 and another part of the electronic component 12 is surrounded by the body portion 111. The electronic element 12 may be, but is not limited to, a passive component such as a capacitor, a resistor or the like. The electronic component 12 may have a thickness, which may be substantially the same as a length of the first electrical contact 121 or of the second electrical contact 122, from approximately 90 μm to approximately 110 μm.

The patterned conductive layer 14 may include a patterned conductive layer 14a disposed on the upper surface 111a of the body portion 111 and a patterned conductive layer 14b disposed on the patterned conductive layer 14a. The patterned conductive layer 14 may include, but is not limited to, copper (Cu) or another suitable metal or alloy. The patterned conductive layer 14a may include material(s) the same as or different from that of the patterned conductive layer 14b. The patterned conductive layer 14a may have a thickness from approximately 1 μm to approximately 5 μm. The patterned conductive layer 14b may have a thickness from approximately 10 μm to approximately 30 μm.

The patterned conductive layer 15 may include a patterned conductive layer 15a disposed on the upper surface 13a of the second dielectric layer 13 and a patterned conductive layer 15b disposed on the patterned conductive layer 15a. The patterned conductive layer 15 may be buried in the body portion 111. A part 15a1, 15b1 of the patterned conductive layer 15 surrounds the wall portion 112. The part 15a1, 15b1 of the patterned conductive layer 15 may have an annular or ring profile that surrounds the wall portion 112. The part 15a1, 15b1 of the patterned conductive layer 15 may have an inner surface which is substantially coplanar with, or in contact with, the outer surface of the wall portion 112. The part 15a1, 15b1 of the patterned conductive layer 15 may be electrically isolated from the circuit(s) formed in the circuit board 1. The patterned conductive layer 15 may include material(s) the same as or different from that of patterned conductive layer 14. The patterned conductive layer 15a may have a thickness from approximately 1 μm to approximately 5 μm. The patterned conductive layer 15b may have a thickness from approximately 10 μm to approximately 30 μm.

The patterned conductive layer 16 is buried in the second dielectric layer 13 and exposed from the lower surface 13b of the second dielectric layer 13. The patterned conductive layer 16 may have a surface which is substantially coplanar with, or slightly depressed in (not shown), the lower surface 13b of the second dielectric layer 13. The patterned conductive layer 16 may include material(s) the same as or different from that of patterned conductive layer 14 and/or patterned conductive layers 15, 17, or 18. The patterned conductive layer 16 may have a thickness from approximately 10 μm to approximately 30 μm.

The patterned conductive layer 17 is disposed on the lower surface 13b of the second dielectric layer 13. A part 17a of patterned conductive layer 17 is disposed on a part 16a of the patterned conductive layer 16 buried in the second dielectric layer 13. A part 17b of patterned conductive layer 17 is disposed on a part 16b of the patterned conductive layer 16 buried in the second dielectric layer 13. The parts 17a and 17b of the patterned conductive layer 17 may include material(s) the same as or different from that of patterned conductive layer 14 and/or patterned conductive layers 15, 16 or 18. The part 17a of the patterned conductive layer 17 may include material(s) the same as or different from that of the part 17b of the patterned conductive layer 17. The patterned conductive layer 17 may have a thickness from approximately 1 μm to approximately 5 μm. The parts 17a and 17b of the patterned conductive layer 17 may have the same or different thicknesses.

The patterned conductive layer 18 is disposed on the patterned conductive layer 17 and on the end 112a of the wall portion 112. A part 18a of the patterned conductive layer 18 is disposed on the part 17a of the patterned conductive layer 17 and on the end 112a of the wall portion 112. The part 18a of the patterned conductive layer 18 is in contact with the first electrical contact 121 of the electronic component 12. A part 18b of the patterned conductive layer 18 is disposed on the part 17b of the patterned conductive layer 17 and on the end 112a of the wall portion 112. The part 18b of the patterned conductive layer 18 is in contact with the second electrical contact 122 of the electronic component 12. The parts 18a and 18b of the patterned conductive layer 18 may include material(s) the same as or different from that of patterned conductive layer 14 and/or patterned conductive layers 15, 16 or 17. The part 18a of the patterned conductive layer 18 may include material(s) the same as or different from that of part 18b of the patterned conductive layer 18. The patterned conductive layer 18 may have a thickness from approximately 10 µm to approximately 30 µm. The parts 18a and 18b of the patterned conductive layer 18 may have the same or different thicknesses.

It is contemplated that a multi-layer structure which may include, for example, the part 17a of the patterned conductive layer 17 and the part 18a of the patterned conductive layer 18, may be disposed on the lower surface 13b of the second dielectric layer 13 and on the end 112a of the wall portion 112, to provide an electrical connection between the part 16a of the patterned conductive layer 16 and the first electrical contact 121. It is further contemplated that another multi-layer structure which may include, for example, the part 17b of the patterned conductive layer 17 and the part 18b of the patterned conductive layer 18, may be disposed on the lower surface 13b of the second dielectric layer 13 and on the end 112a of the wall portion 112, to provide an electrical connection between part 16b of the patterned conductive layer 16 and the second electrical contact 122.

The solder resist layer 19a is disposed on the lower surface 13b of the second dielectric layer 13. The solder resist layer 19a may cover the electronic component 12 and the patterned conductive layers 17 and 18. The solder resist layer 19a may define an opening to expose a portion of the patterned conductive layer 16 for contacting another device, e.g. a flip-chip-mounted semiconductor die. The solder resist layer 19b is disposed on the upper surface 111a of the body portion 111 of the first dielectric layer 11. The solder resist layer 19b may cover the patterned conductive layers 14a and 14b. The solder resist layer 19b may define one or more openings to expose a portion of the patterned conductive layer 14 for contacting another device, e.g. a printed circuit board.

The semiconductor package structure 1 may further include a number of vias, such as the illustrated vias 113, 133, 114a and 114b.

At least one via 113 is disposed in the first dielectric layer 11 to electrically connect the patterned conductive layer 14 to the patterned conductive layer 15.

At least one via 133 is disposed in the second dielectric layer 13 to electrically connect the patterned conductive layer 15 to the patterned conductive layer 16.

At least one via 114, such as via 114a and via 114b, is disposed in the first dielectric layer 11 to electrically connect the patterned conductive layer 14 to the electronic component 12. For example, the via 114a may electrically connect the patterned conductive layer 14 to the first electrical contact 121 of the electronic component 12. Additionally, the via 114b may electrically connect the patterned conductive layer 14 to the second electrical contact 122 of the electronic component 12.

Figure 1B:
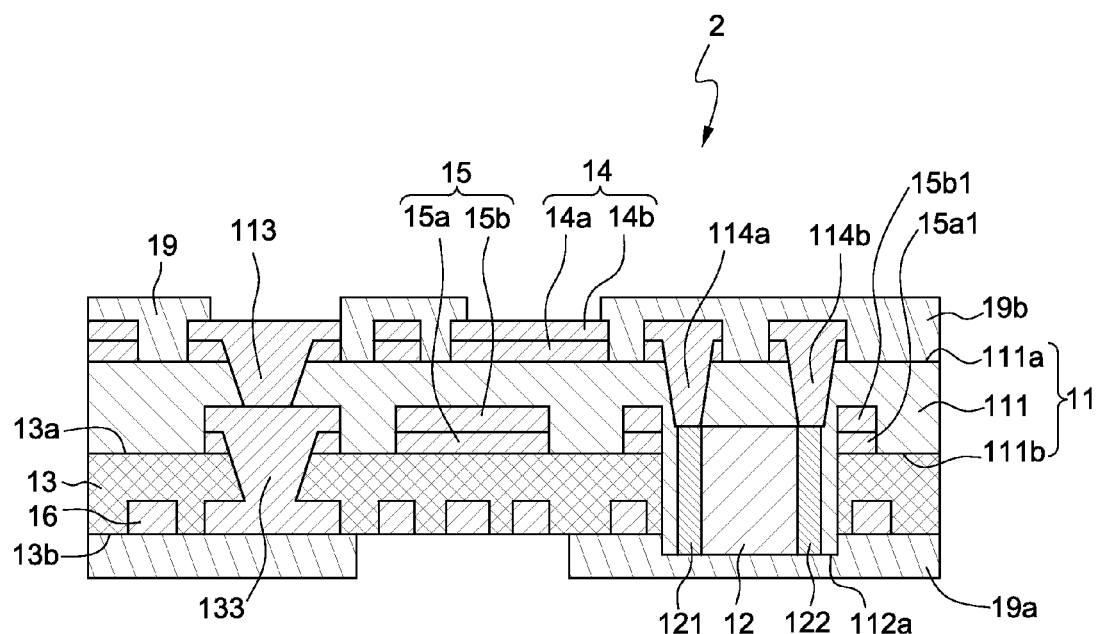
FIG. 1B is a cross-sectional view of a circuit board in accordance with another embodiment of the present disclosure.

FIG. 1B is a cross-sectional view of a semiconductor package structure 2 in accordance with another embodiment of the present disclosure. Referring to FIG. 1B, the semiconductor package structure 2 may be similar to the semiconductor package structure 1 as described and illustrated with reference to FIG. 1, except that the patterned conductive layers 17 and 18 are eliminated.

FIG. 2A, FIG. 2B, FIG. 2C, FIG. 2D, FIG. 2E, FIG. 2F, FIG. 2G, FIG. 2H, FIG. 2I, FIG. 2J, FIG. 2K, FIG. 2L, FIG. 2M, FIG. 2N and FIG. 2O illustrate a manufacturing method in accordance with an embodiment of the present disclosure.

Figure 2A:
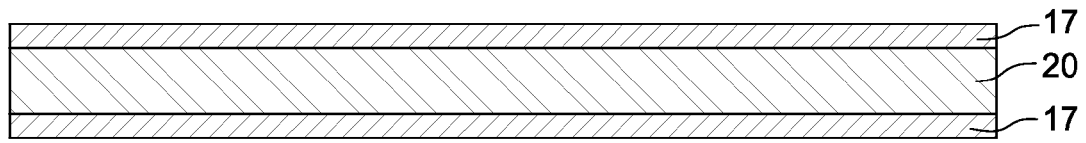
FIG. 2A, FIG. 2B, FIG. 2C, FIG. 2D, FIG. 2E, FIG. 2F, FIG. 2G, FIG. 2H, FIG. 2I, FIG. 2J, FIG. 2K, FIG. 2L, FIG. 2M, FIG. 2N and FIG. 2O illustrate a manufacturing method in accordance with an embodiment of the present disclosure.

Referring to FIG. 2A, a carrier 20 is provided. A conductive layer 17 is formed on both sides of the carrier 20 for a subsequent double-side process. In accordance with another embodiment of the present disclosure, the conductive layer 17 may be formed on one side of the carrier 20 for a subsequent single-side process. The conductive layer 17 may be laminated onto the carrier 20. The conductive layer 17 may include, but is not limited to, copper or another suitable metal or alloy. The conductive layer 17 may have a thickness from approximately 2 µm to approximately 5 µm.

Figure 2B:
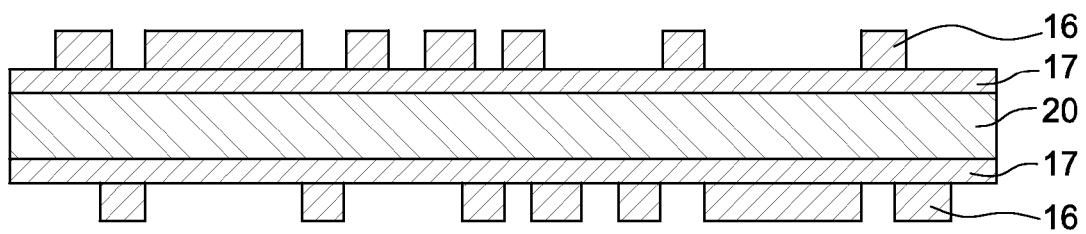

Referring to FIG. 2B, a patterned conductive layer 16 is formed on the conductive layer 17. The patterned conductive layer 16 may be formed, for example, by photo-lithography and plating techniques. The patterned conductive layer 16 may include, but is not limited to, copper or another suitable metal or alloy. The patterned conductive layer 16 may have a thickness from approximately 10 µm to approximately 30 µm.

Figure 2C:
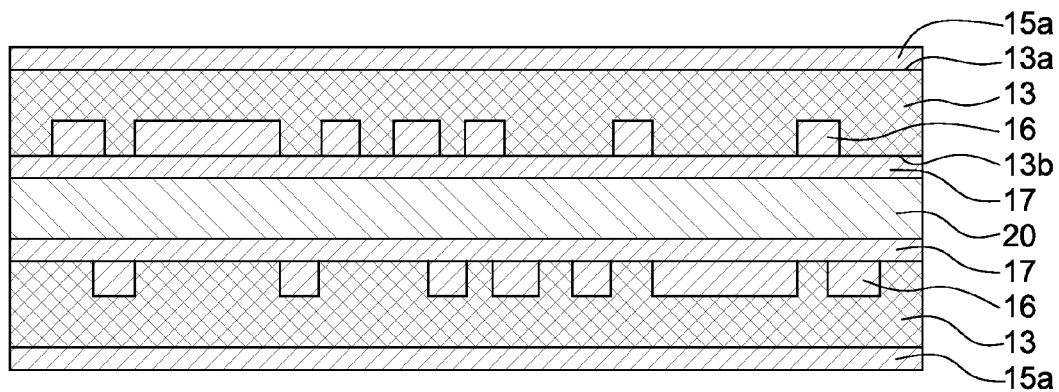

Referring to FIG. 2C, a dielectric layer 13 having an upper surface 13a and an opposing lower surface 13b is laminated onto the conductive layer 17. A conductive layer 15a may be formed on the upper surface 13a of the dielectric layer 13 prior to or subsequent to the lamination of the dielectric layer 13. After the lamination, the dielectric layer 13 may bury or envelop the patterned conductive layer 16. The dielectric layer 13 may include but is not limited to P.P. Examples of P.P. may include, but are not limited to, a multi-layer structure formed by stacking or laminating a number of pre-impregnated materials/sheets. The dielectric layer 13 may have a thickness from approximately 50 µm to approximately 110 µm. The conductive layer 15a may include, but is not limited to, copper or another suitable metal or alloy. The conductive layer 15a may have a thickness from approximately 1 µm to approximately 5 µm.

Figure 2D:
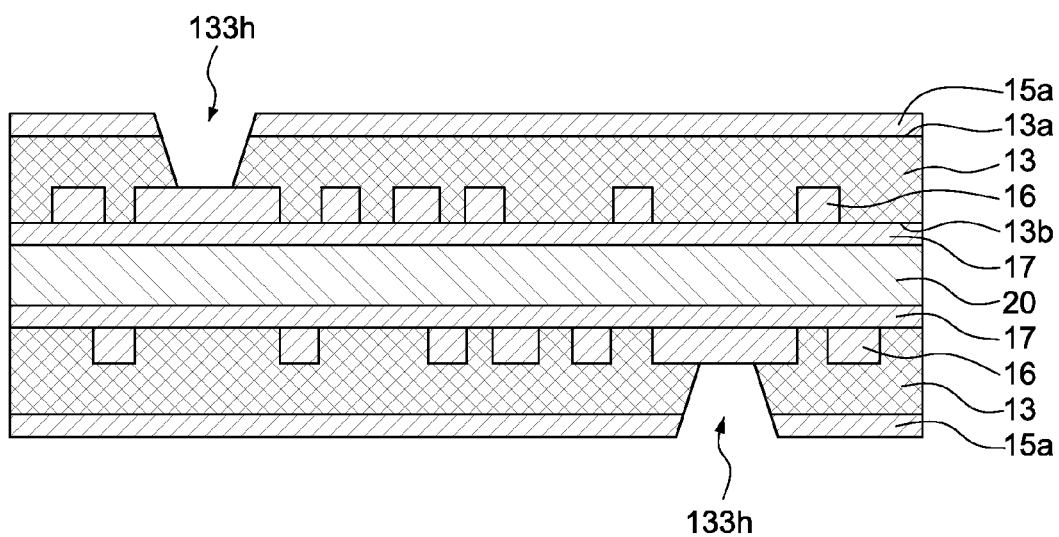

Referring to FIG. 2D, a via hole 133h is formed in the conductive layer 15a and the dielectric layer 13 to expose a portion of the patterned conductive layer 16. The via hole 133h may be formed, for example, by etching, laser drilling or another suitable technique. The via hole 133h may have a width from approximately 30 µm to approximately 100 µm. The via hole 133h may have a depth from approximately 20 µm to approximately 105 µm. As illustrated in FIG. 2D, via hole 133h may be wider at one end than the other. Alternatively, the via hole 133h may have a substantially consistent diameter.

Figure 2E:
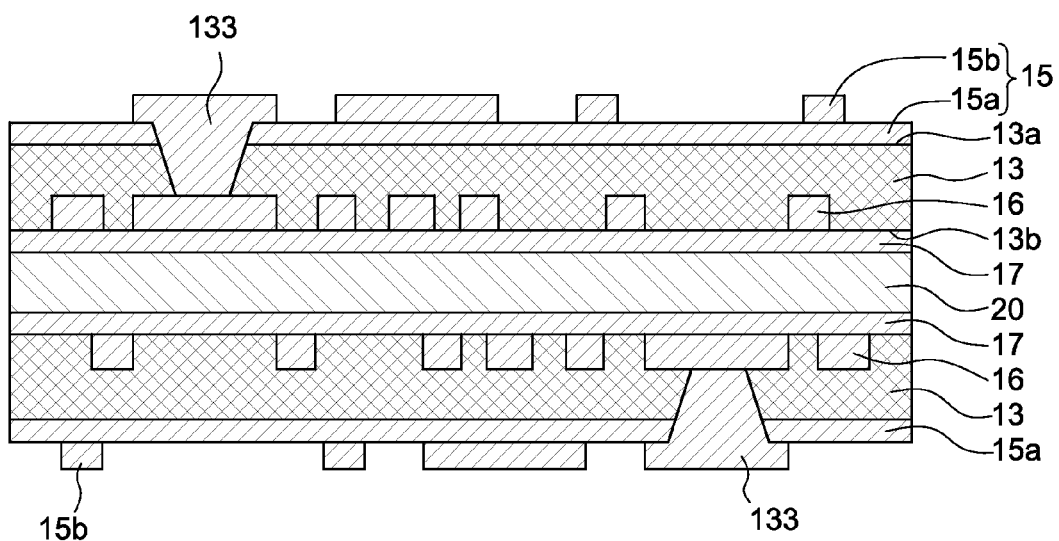

Referring to FIG. 2E, a via 133 is formed in the via hole 133h and on the conductive layer 15a. A patterned conductive layer 15b is also formed on the conductive layer 15a. The via 133 and the patterned conductive layer 15b may be formed in one common step. In accordance with another embodiment of the present disclosure, the via 133 and the patterned conductive layer 15b may be formed in different steps. The via 133 and the patterned conductive layer 15b may be formed, for example, by photo-lithography and plating techniques. The via 133 and the patterned conductive layer 15b may include, but are not limited to, copper or another suitable metal or alloy. The patterned conductive layer 15b may have a thickness from approximately 10 µm to approximately 30 µm. The portion of the via 133 that is on the conductive layer 15a may have a thickness from approximately 10 µm to approximately 30 µm. The thickness of the patterned conductive layer 15b and the thickness of the portion of the via 133 that is on the conductive layer 15a may be the same or different.

Figure 2F:
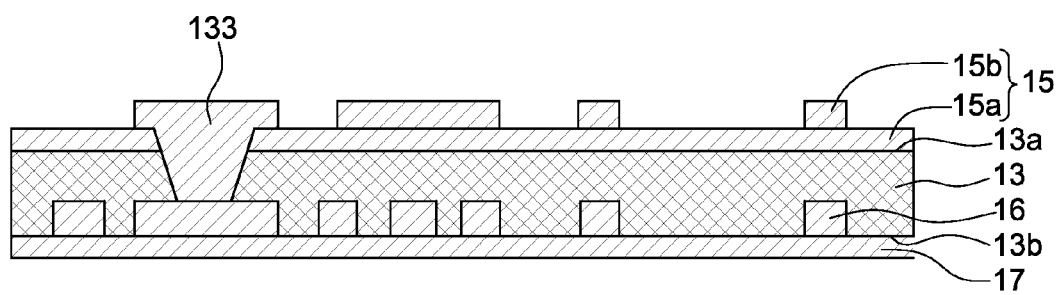

Referring to FIG. 2F, the carrier 20 is released from the conductive layer 17.

Figure 2G:
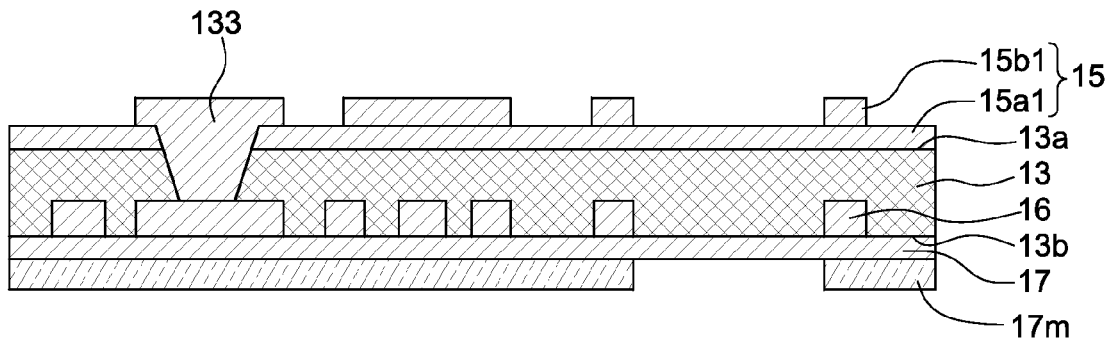

Referring to FIG. 2G, a patterned mask 17m is formed on the conductive layer 17. The patterned masks 17m may be formed, for example, by a photo-lithography technique.

Figure 2H:
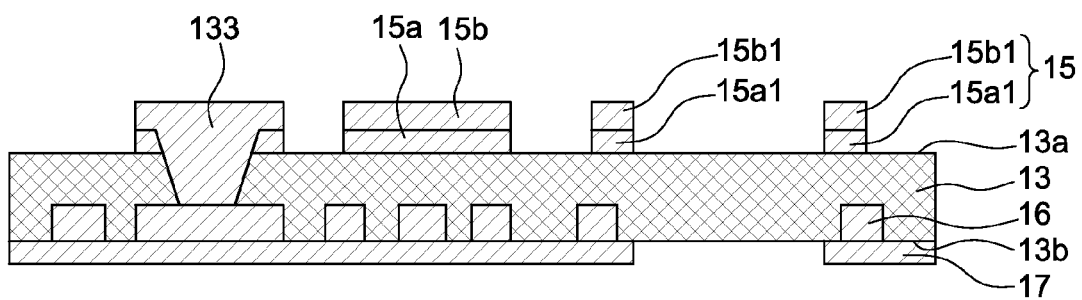

Referring to FIG. 2H, portions of the conductive layer 15a which are exposed by the patterned conductive layer 15b may be removed, such as by etching, to form a patterned conductive layer 15b. Additionally, a portion of the conductive layer 17 which is exposed by the patterned mask 17m is removed, such as by etching, to form a patterned conductive layer 17. Subsequently, the mask 17m may be removed, such as by a stripping technique. Since most of the patterned conductive layer 17 remains, the patterned conductive layer 17 can provide sufficient stiffness for handling in the subsequent process steps.

Figure 2I:
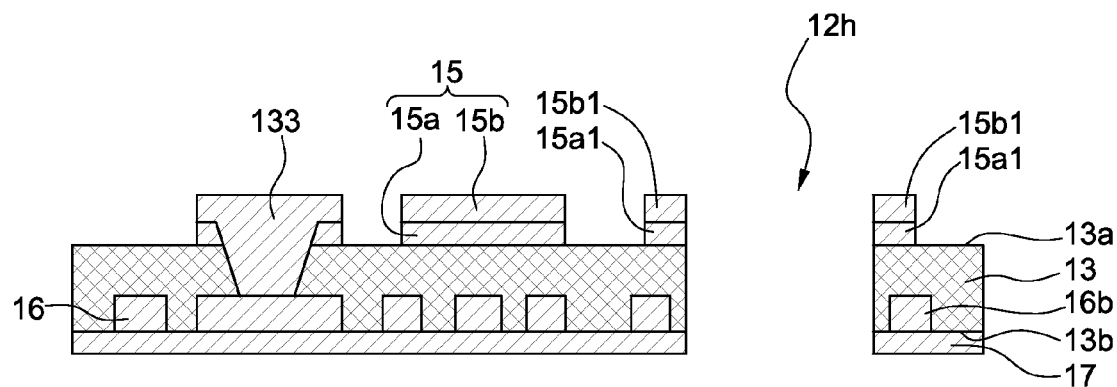

Referring to FIG. 2I, a part of the dielectric layer 13 is removed to form a through hole 12h. The through hole 12h may be formed, for example, by a laser drill technique. A part 15a1 and a part 15b1 of the patterned conductive layer 15 may be used to assist in establishing a relatively precise formation of the through hole 12h. For example, the parts 15a1 and 15b1 of the patterned conductive layer 15 may be formed to have an annular profile and may be used as a guide to facilitate the laser drilling.

Figure 2J:
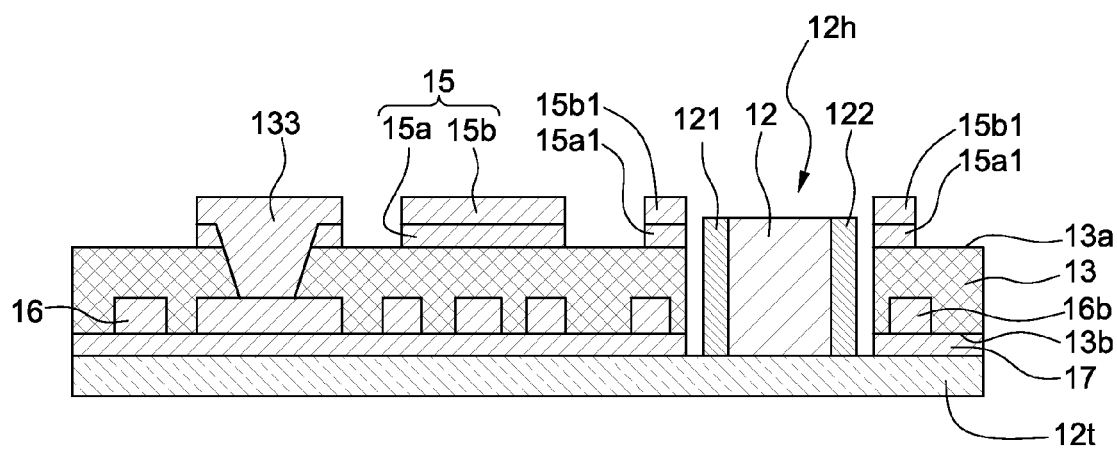

Referring to FIG. 2J, a support member 12t may be attached or bonded to the patterned conductive layer 17. The support member 12t may be, for example, a tape. Next, an electronic component 12 is placed in the hole 12h and on the support member 12t. In the example shown in FIG. 2J, electronic component 12 has a first electrical contact 121 and a second electrical contact 122. Other electronic components may have additional contacts. The electrical contacts 121 and 122 extend from a upper surface of the electronic component 12 through the side surface of the electronic component 12 to a lower surface of the electronic component 12, where upper surface, side surface, and lower surface in this context are with respect to the orientation shown in FIG. 2J.

Figure 2K:
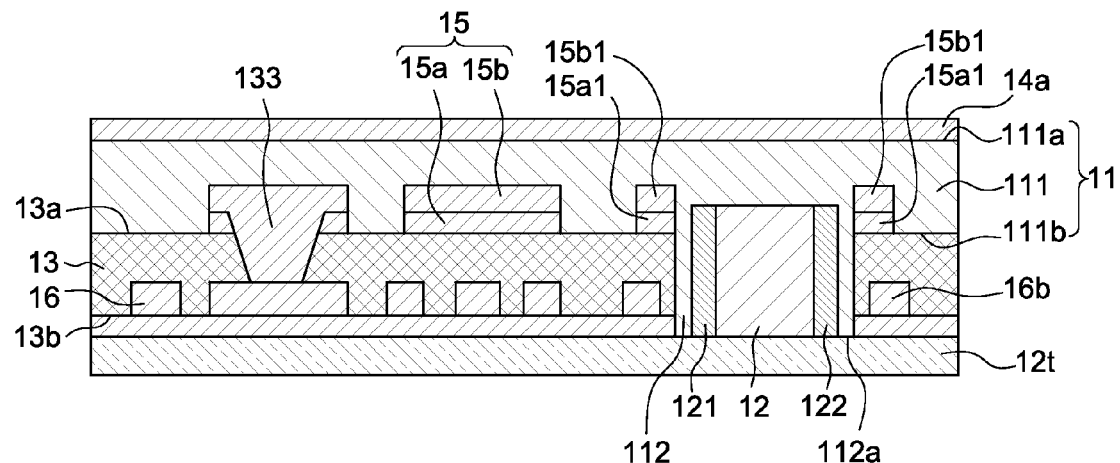

Referring to FIG. 2K, a dielectric layer 11 is laminated onto the upper surface 13a of the dielectric layer 13 and fills a gap between the side wall of the hole 12h and the component 12. A conductive layer 14a may be formed on an upper surface 111a of the dielectric layer 11 prior to, or subsequent to, the lamination of the dielectric layer 11. After the lamination, the dielectric layer 11 may bury or envelop the patterned conductive layer 15 and the electronic component 12. The dielectric layer 11 may include a body portion 111 on the upper surface 13a of the dielectric layer 13 and a wall portion 112 within the gap between the side wall of the hole 12h and the component 12. The wall portion 112 has an end 112a which extends beyond the lower surface 13b of the dielectric layer 13. The end 112a of the wall portion 112 extends to the support member 12t. The dielectric layer 11 may include but is not limited to P.P. Examples of P.P. may include, but are not limited to, a multi-layer structure formed by stacking or laminating a number of pre-impregnated materials/sheets. The conductive layer 14a may include, but is not limited to, copper or another suitable metal or alloy. The conductive layer 14a may have a thickness from approximately 1 μm to approximately 5 μm.

Figure 2L:
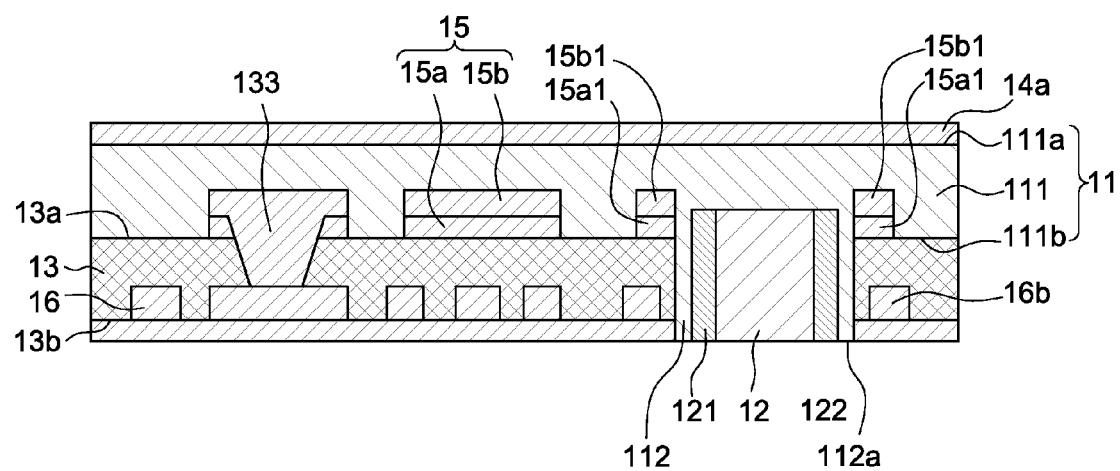

Referring to FIG. 2L, the support member 12t is removed from the patterned conductive layer 17. As illustrated in FIG. 2L, a lower surface of the patterned conductive layer 17, the end 112a of the wall portion 112, a surface of the first electrical contact 121 and a surface of the second electrical contact 122 are substantially coplanar.

Figure 2M:
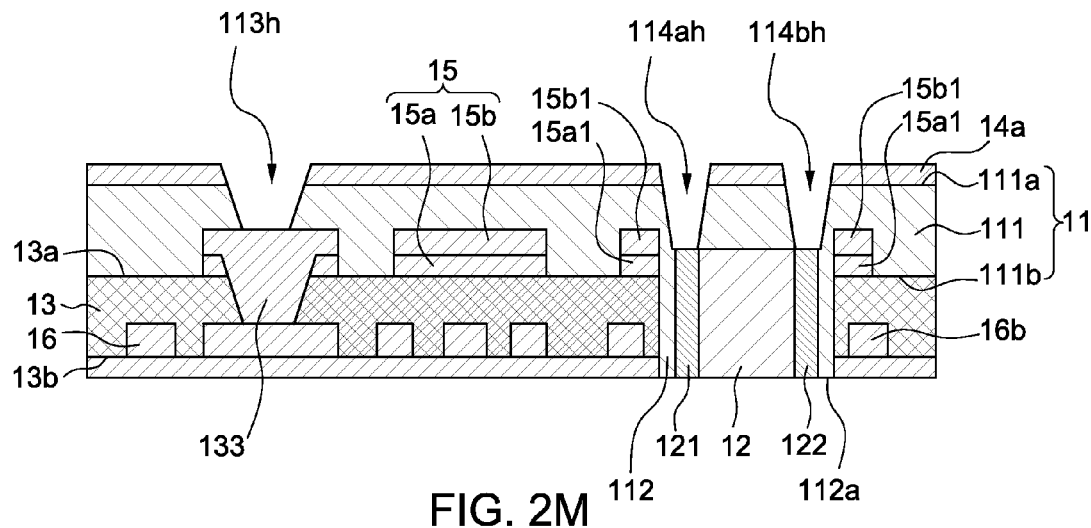

Referring to FIG. 2M, a number of via holes, such as the via holes 113h, 114ah and 114bh illustrated, are formed in the conductive layer 14a and the dielectric layer 11. The illustrated via holes 113h, 114ah and 114bh respectively expose the patterned conductive layer 15, the first electrical contact 121 and the second electrical contact 122. The via holes 113h, 114ah and 114bh may be formed, for example, by etching, laser drilling or another suitable technique. The via hole 113h may have a width from approximately 30 μm to approximately 100 μm. The via hole 113h may have a depth from approximately 10 μm to approximately 80 μm. The via hole 114ah may have a width from approximately 30 μm to approximately 100 μm. The via hole 114ah may have a depth from approximately 10 μm to approximately 80 μm. The via hole 114bh may have a width from approximately 30 μm to approximately 100 μm. The via hole 114bh may have a depth from approximately 10 μm to approximately 80 μm. Although illustrated in FIG. 2M as being wider on one end than the other end, via holes 113h, 114ah and 114bh each may have substantially consistent diameters.

Figure 2N:
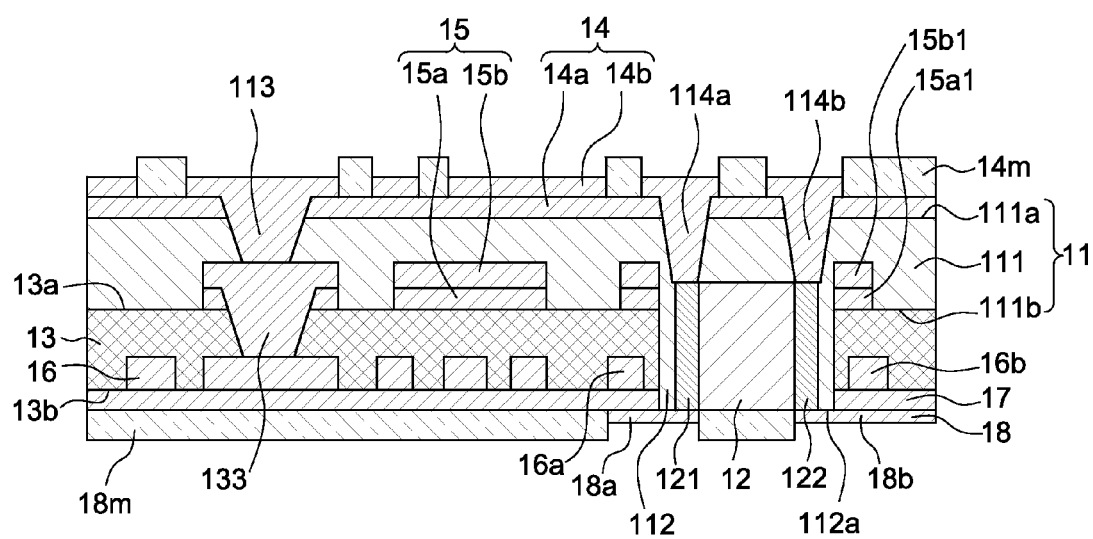

Referring to FIG. 2N, a number of vias 113, 114a and 114b are formed in the via holes 113h, 114ah and 114bh, and on the conductive layer 14a. A patterned conductive layer 14b is formed on the conductive layer 14a using a patterned mask 14m. A patterned conductive layer 18 is formed on the lower surface of the patterned conductive layer 17 and the end 112a of the wall portion 112. A part 18a of the patterned conductive layer 18 extends over the first electrical contact 121 of the electronic component 12, and a part 18b of the patterned conductive layer extends over the second electrical contact 122 of the electronic component 12. The patterned conductive layer 18 is formed using a patterned mask 18m. The vias 113, 114a and 114b and the patterned conductive layers 14b and 18 may be formed in one common step. In accordance with another embodiment of the present disclosure, the vias 113, 114a and 114b and the patterned conductive layers 14b and 18 may be formed in different steps. The vias 113, 114a and 114b and the patterned conductive layers 14b and 18 may be formed, for example, by photo-lithography and plating techniques. The vias 113, 114a and 114b and the patterned conductive layers 14b and 18 may include, but are not limited to, copper or another suitable metal or alloy. The patterned conductive layer 14b may have a thickness from approximately 10 μm to approximately 30 μm. The patterned conductive layer 18 may have a thickness from approximately 10 μm to approximately 30 μm. The parts 18a and 18b of the patterned conductive layer 18 may have the same or different thicknesses.

Figure 2O:
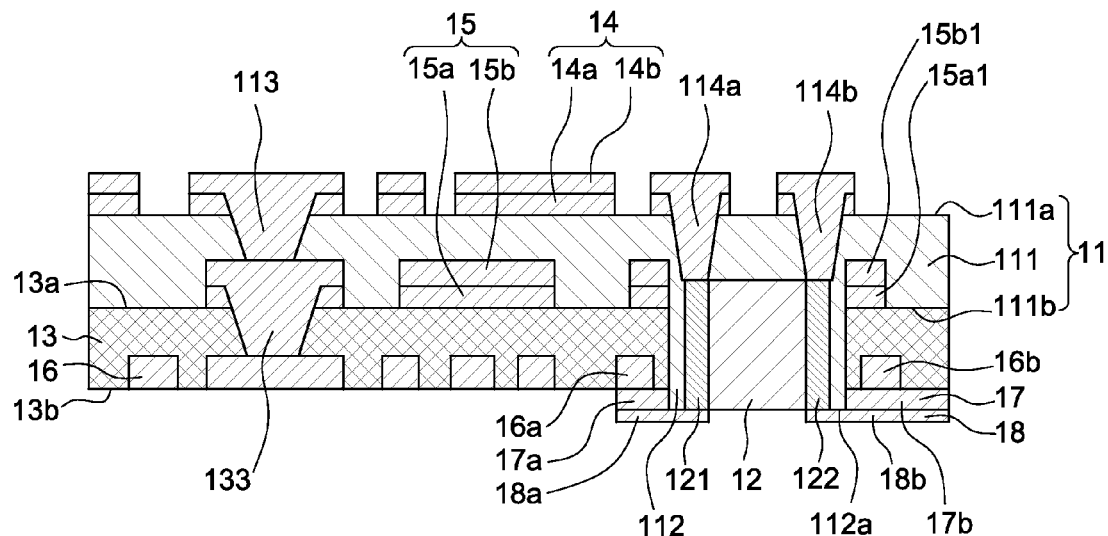

Referring to FIG. 2O, the patterned masks 14m and 18m are removed. Portions of the conductive layer 14a are removed to form patterned conductive layer 14a. The part of the patterned conductive layer 17 which is not covered by the patterned conductive layer 18 is removed to form parts 17a and 17b of the patterned conductive layer 17. A solder resist layer (e.g., such as solder resist layer 19a in FIG. 1A, not shown in FIG. 2O) may be formed on the lower surface 13b of the dielectric layer 13, and a solder resist layer (e.g., such as solder resist layer 19b in FIG. 1A, not shown in FIG. 2O) may be formed on the upper surface 111a of the body portion 111 of the dielectric layer 11 to form the circuit board 1 as shown in FIG. 1A. When formed, the solder resist layer 19a covers the electronic component 12 and the patterned conductive layers 17 and 18. When formed, the solder resist layer 19b covers the vias 114a and 114b, portions of the patterned conductive layers 14a and 14b, and the upper surface 111a of the dielectric layer 11.

FIG. 2A, FIG. 2B, FIG. 2C, FIG. 2D, FIG. 2E, FIG. 2F, FIG. 2G, FIG. 2H, FIG. 2I, FIG. 2J, FIG. 2K, FIG. 2L, FIG.

Figure 2P:
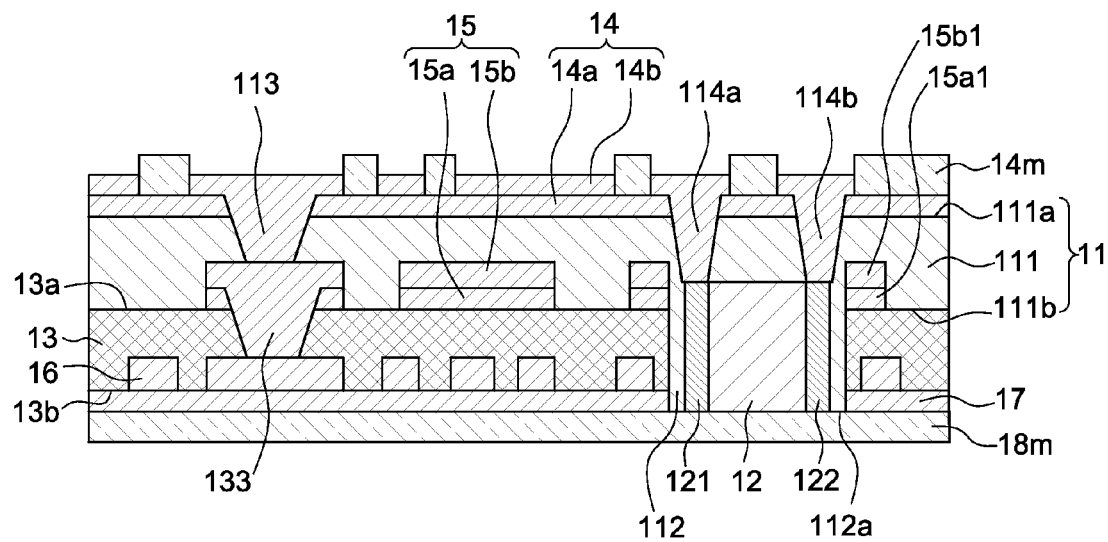
FIG. 2P and FIG. 2Q illustrate a manufacturing method in accordance with another embodiment of the present disclosure.
Figure 2Q:
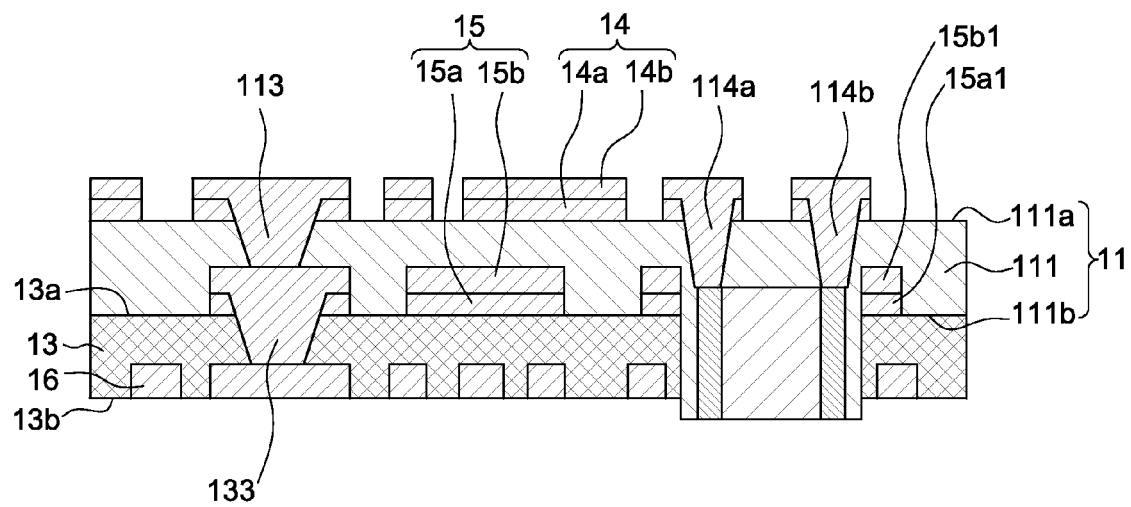

2M, FIG. 2P and FIG. 2Q illustrate a semiconductor process in accordance with another embodiment of the present disclosure.

The process as illustrated with reference to FIG. 2A, FIG. 2B, FIG. 2C, FIG. 2D, FIG. 2E, FIG. 2F, FIG. 2G, FIG. 2H, FIG. 2I, FIG. 2J, FIG. 2K, FIG. 2L and FIG. 2M may be referred to the above paragraphs and is not repeated here.

Referring to FIG. 2P, the step as shown in FIG. 2P is similar to the step as described and illustrated with reference to FIG. 2N, except that the mask 18m covers the entire patterned conductive layer 17, the end 112a of the wall portion 112 and the electronic component 12; and the formation of the patterned conductive layer 18 is omitted.

Referring to FIG. 2Q, the step as shown in FIG. 2Q is similar to the step as described and illustrated with reference to FIG. 2O, except that the patterned conductive layer 18 is omitted (as described with respect to FIG. 2P), and the patterned conductive layer 17 is fully removed. A solder resist layer (e.g., the solder resist layer 19a shown in FIG. 1B, not shown in FIG. 2Q) may be formed on the lower surface 13b of the dielectric layer 13, and a solder resist layer (e.g., the solder resist layer 19b shown in FIG. 1B, not shown in FIG. 2Q) may be formed on the upper surface 111a of the body portion 111 of the dielectric layer 11 to form the semiconductor package structure 2 as shown in FIG. 1B. When formed, the solder resist layer 19a covers the electronic component 12 and the patterned conductive layer 16. When formed, the solder resist layer 19b covers the vias 114a and 114b, portions of the patterned conductive layers 14a and 14b, and the upper surface 111a of the dielectric layer 11.

Figure 3A:
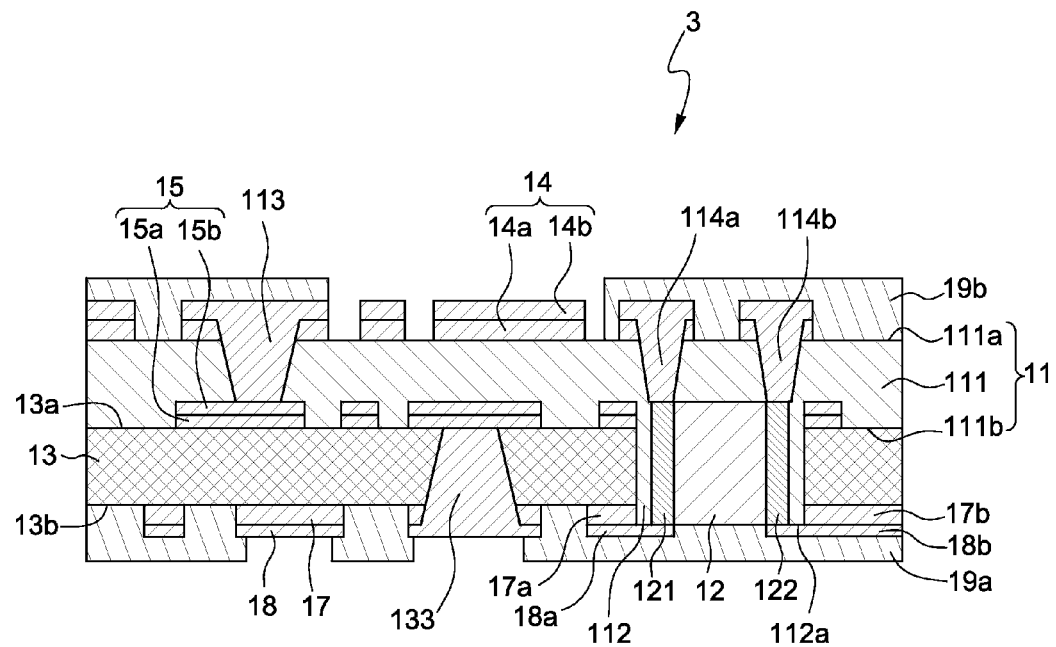
FIG. 3A is a cross-sectional view of a circuit board in accordance with another embodiment of the present disclosure.

FIG. 3A is a cross-sectional view of a semiconductor package structure in accordance with another embodiment of the present disclosure. Referring to FIG. 3A, the semiconductor package structure 3 may be similar to the semiconductor package structure 1 as described and illustrated with reference to FIG. 1A, except that the patterned conductive layer 16 is eliminated and the solder resist layer 19a may comprise an opening to expose a portion of the patterned conductive layer 18 for contacting another device, e.g. a flip-chip-mounted semiconductor die.

Figure 3B:
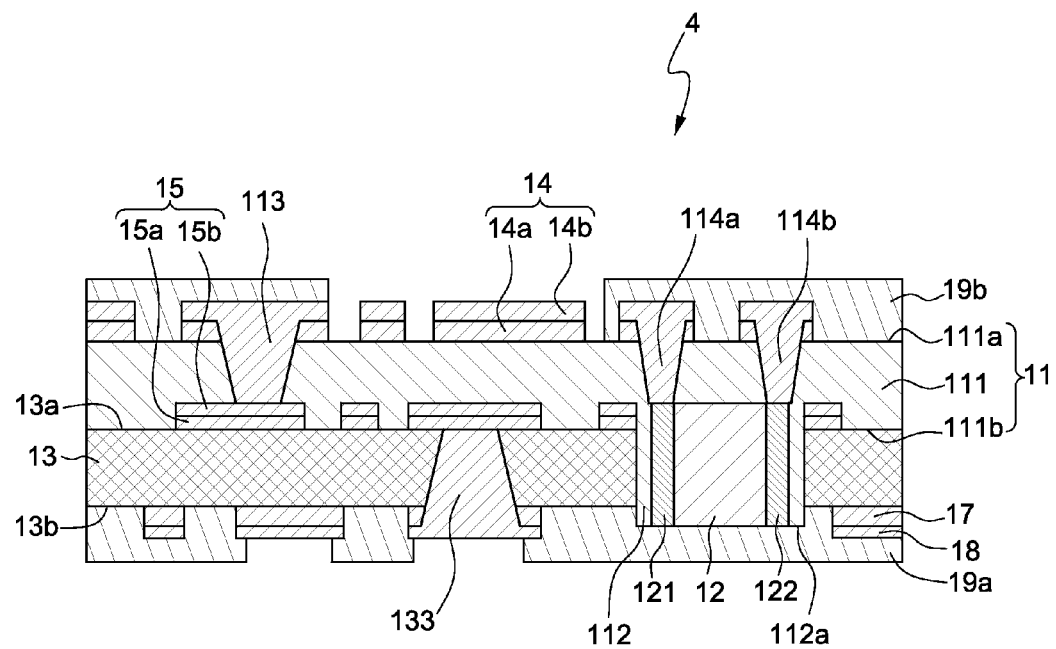
FIG. 3B is a cross-sectional view of a circuit board in accordance with another embodiment of the present disclosure.

FIG. 3B is a cross-sectional view of a semiconductor package structure in accordance with another embodiment of the present disclosure. Referring to FIG. 3B, the semiconductor package structure 4 may be similar to the semiconductor package structure 3 as described and illustrated with reference to FIG. 3A, except that the parts 17a, 17b of the patterned conductive layer 17 (i.e., the parts contacting the wall portion 112 of the dielectric layer 11) are omitted, and the parts 18a and 18b of the patterned conductive layer 18 (i.e., the parts that would have contacted the respective omitted parts 17a and 17b of the patterned conductive layer 17, the wall portion 112, and the first and second electrical contacts 121 and 122) are omitted.

FIG. 4A, FIG. 4B, FIG. 4C, FIG. 4D, FIG. 4E, FIG. 4F, FIG. 4G, FIG. 4H and FIG. 4I illustrate a semiconductor process in accordance with another embodiment of the present disclosure.

Figure 4A:
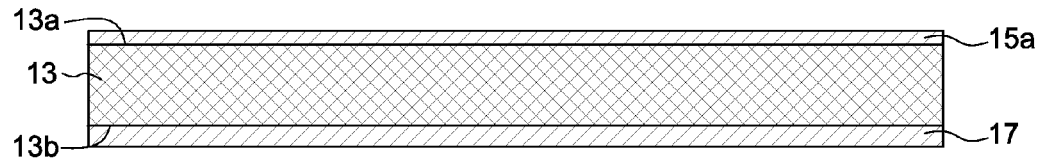
FIG. 4A, FIG. 4B, FIG. 4C, FIG. 4D, FIG. 4E, FIG. 4F, FIG. 4G, FIG. 4H and FIG. 4I illustrate a manufacturing method in accordance with another embodiment of the present disclosure.

Referring to FIG. 4A, a dielectric layer 13 is provided. A conductive layer 15a is formed on an upper surface 13a of the dielectric layer 13. A conductive layer 17 is formed on a lower surface 13b of the dielectric layer 13. The conductive layers 15a and 17 may be laminated onto the carrier 20. The conductive layer 15a may include, but is not limited to, copper or another suitable metal or alloy. The conductive layer 15a may have a thickness from approximately 1 μm to approximately 5 μm. The conductive layer 17 may include, but is not limited to, copper or another suitable metal or alloy. The conductive layer 17 may have a thickness from approximately 1 μm to approximately 5 μm.

Figure 4B:
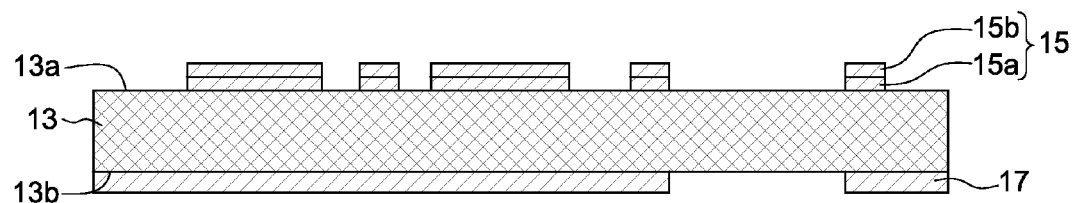

Referring to FIG. 4B, a patterned conductive layer 15 is formed on the upper surface 13a of the dielectric layer 13. The conductive layer 17 is patterned to expose a part of the dielectric layer 13. The patterned conductive layer 15 may include a single layer or several layers. The patterned conductive layer 15 may include the patterned conductive layer 15a and 15b. The patterned conductive layer 15a and 15b may be formed by photo-lithography, plating and etching techniques, for example. The patterned conductive layer 17 may be formed by photo-lithography and etching techniques, for example. Since most of the conductive layer 17 remains after patterning, it can provide sufficient stiffness for handling in subsequent process steps. The patterned conductive layer 15b may include material(s) the same as or different from that of the patterned conductive layer 15a. The patterned conductive layer 15b may have a thickness from approximately 10 μm to approximately 30 μm.

Figure 4C:
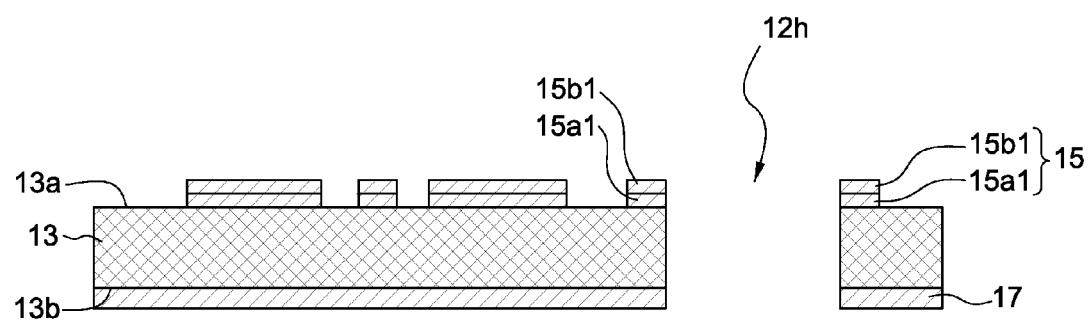

Referring to FIG. 4C, the part of the dielectric layer 13 exposed by the patterned conductive layer 17 is removed to form a through hole 12h. The through hole 12h may be formed, for example, by a laser drill technique. A part 15a1 and a part 15b1 of the patterned conductive layer 15 may be used to help a relatively precise formation of the through hole 12h. For example, the parts 15a1 and 15b1 of the patterned conductive layer 15 may be formed to have an annular profile and may be used as a guide to facilitate the laser drilling.

Figure 4D:
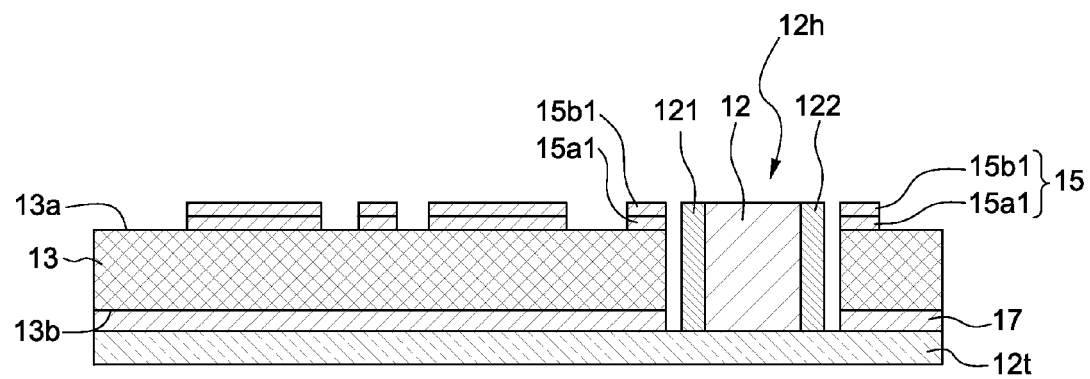

Referring to FIG. 4D, a support member 12t may be attached or bonded to the patterned conductive layer 17. The support member 12t may be, for example, a tape. Next, an electronic component 12 is placed in the hole 12h and on the support member 12t. The electronic component 12 has a first electrical contact 121 and a second electrical contact 122. The electrical contacts 121 and 122 extend from a upper surface of the electronic component 12 through the side surface of the electronic component 12 to a lower surface of the electronic component 12, where upper surface, side surface, and lower surface in this context are with respect to the orientation shown in FIG. 4D.

Figure 4E:
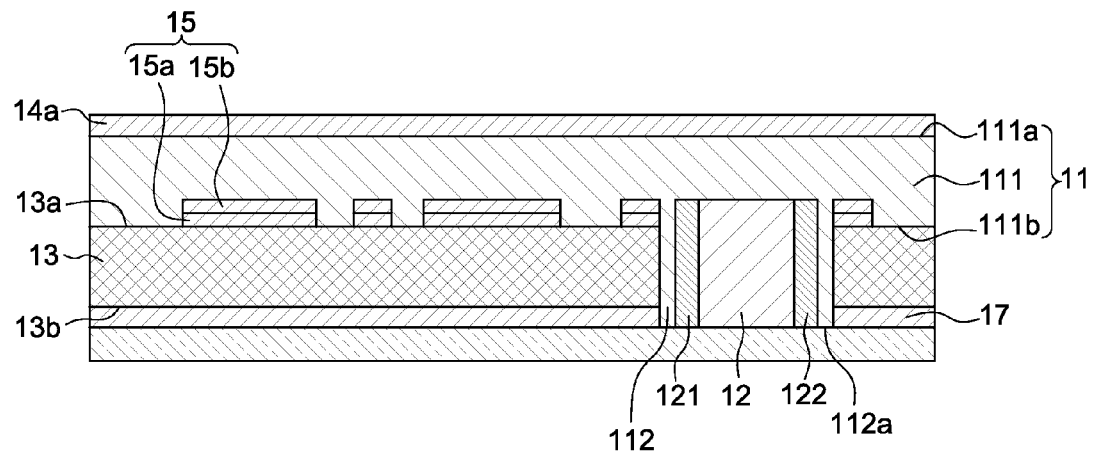

Referring to FIG. 4E, a dielectric layer 11 is laminated onto the upper surface 13a of the dielectric layer 13 and fills a gap between the side wall of the hole 12h and the component 12. A conductive layer 14a may be formed on the upper surface 111a of the dielectric layer 11 prior to or subsequent to the lamination of the dielectric layer 11. After the lamination, the dielectric layer 11 may bury or envelop the patterned conductive layer 15 and the electronic component 12. The dielectric layer 11 may include a body portion 111 on the upper surface 13a of the dielectric layer 13 and a wall portion 112 within the gap between the side wall of the hole 12h and the component 12. The wall portion 112 has an end 112a which extends beyond the lower surface 13b of the dielectric layer 13. The end 112a of the wall portion 112 extends to the support member 12t. The dielectric layer 11 may include but is not limited to P.P. Examples of P.P. may include, but are not limited to, a multi-layer structure formed by stacking or laminating a number of pre-impregnated materials/sheets. The conductive layer 14a may include, but is not limited to, copper or another suitable metal or alloy. The conductive layer 14a may have a thickness from approximately 1 μm to approximately 5 μm.

Figure 4F:
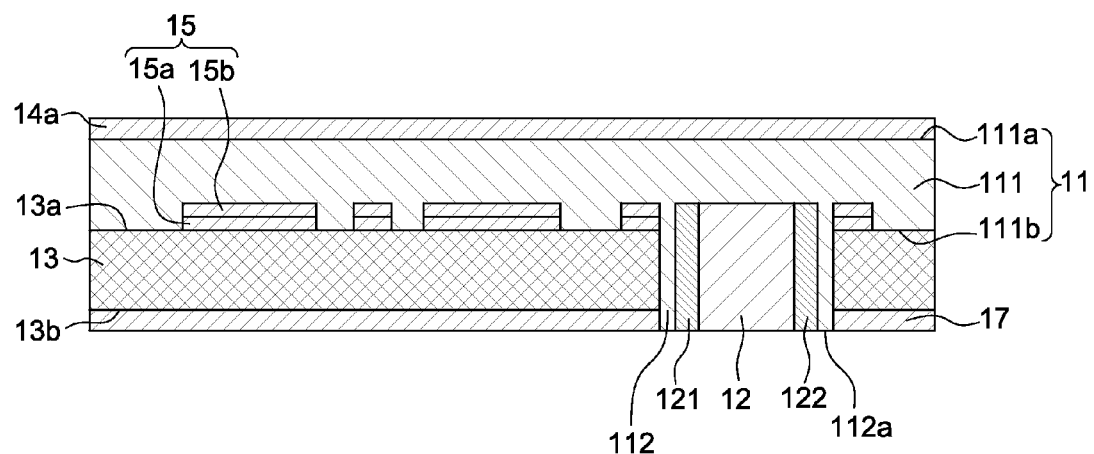

Referring to FIG. 4F, the support member 12t is removed from the patterned conductive layer 17. As illustrated in FIG. 4F, a lower surface of the patterned conductive layer 17, the end 112a of the wall portion 112, a surface of the first electrical contact 121 and a surface of the second electrical contact 122 are substantially coplanar.

Figure 4G:
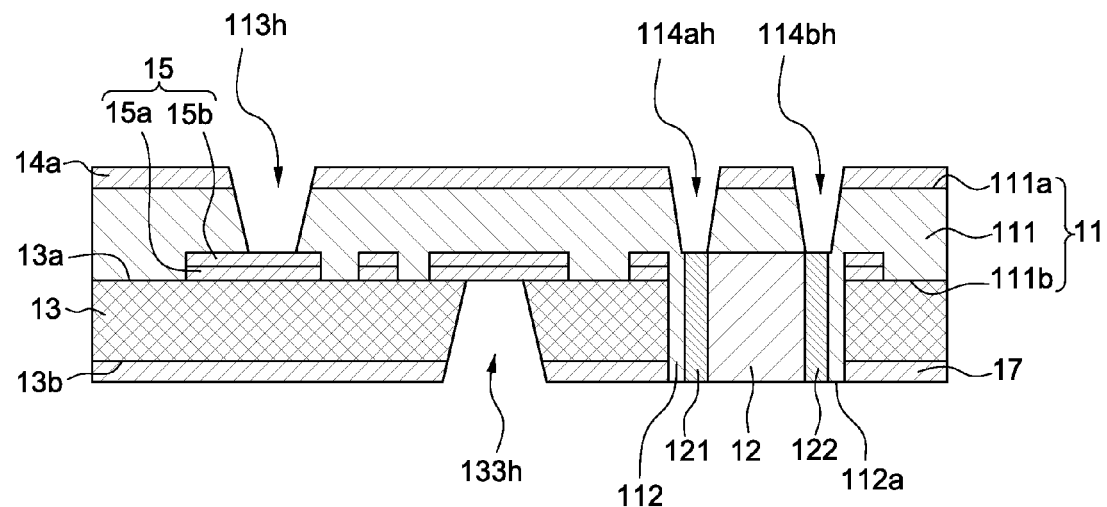

Referring to FIG. 4G, a number of via holes such as the illustrated via holes 113h, 114ah and 114bh are formed in the conductive layer 14a and the dielectric layer 11. The illustrated via holes 113h, 114ah and 114bh respectively expose the patterned conductive layer 15, the first electrical contact 121 and the second electrical contact 122 of the electronic component 12. One or more via holes 133h is formed in the patterned conductive layer 17 and the dielectric layer 13 to expose the patterned conductive layer 15. The via holes 113h, 133h, 114ah and 114bh may be formed, for example, by etching, laser drilling or another suitable technique. The via hole 113 may have a width from approximately 30 μm to approximately 100 μm. The via hole 113 may have a depth from approximately 10 μm to approximately 90 μm. The via hole 133 may have a width from approximately 30 μm to approximately 100 μm. The via hole 133 may have a depth from approximately 50 μm to approximately 100 μm. The via hole 114ah may have a width from approximately 30 μm to approximately 100 μm. The via hole 114ah may have a depth from approximately 10 μm to approximately 80 μm. The via hole 114bh may have a width from approximately 30 μm to approximately 100 μm. The via hole 114bh may have a depth from approximately 10 μm to approximately 80 μm.

Figure 4H:
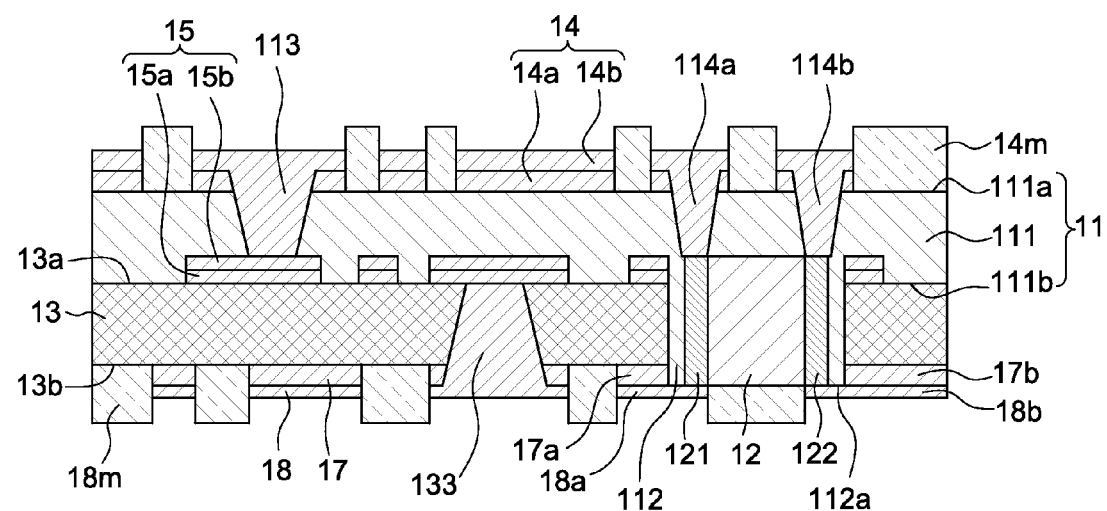

Referring to FIG. 4H, a number of vias 113, 133, 114a and 114b are formed in the via holes 113h, 133h, 114ah and 114bh. The conductive layer 14a is patterned. A patterned conductive layer 14b is formed on the patterned conductive layer 14a using a patterned mask 14m. A patterned conductive layer 18 is formed on the lower surface of the patterned conductive layer 17. A part 18a of the patterned conductive layer is formed on the end 112a of the wall portion 112 and on the first electrical contact 121 of the electronic component 12. A part 18b of the patterned conductive layer 18 is formed on the end 112a of the wall portion 112 and on the second electrical contact 122 of the electronic component 12. The patterned conductive layer 18 formed using a patterned mask 18m. The vias 113, 133, 114a and 114b and the patterned conductive layers 14b and 18 may be formed in one common step. In accordance with another embodiment of the present disclosure, the vias 113, 133, 114a and 114b and the patterned conductive layers 14b and 18 may be formed in different steps. The vias 113, 133, 114a and 114b and the patterned conductive layers 14b and 18 may be formed, for example, by photo-lithography and plating techniques. The vias 113, 133, 114a and 114b and the patterned conductive layers 14b and 18 may include, but are not limited to, copper or another suitable metal or alloy. The patterned conductive layer 14b may have a thickness from approximately 10 μm to approximately 30 μm. The patterned conductive layer 18 may have a thickness from approximately 10 μm to approximately 30 μm. The parts 18a and 18b of the patterned conductive layer 18 may have the same or different thicknesses.

Figure 4I:
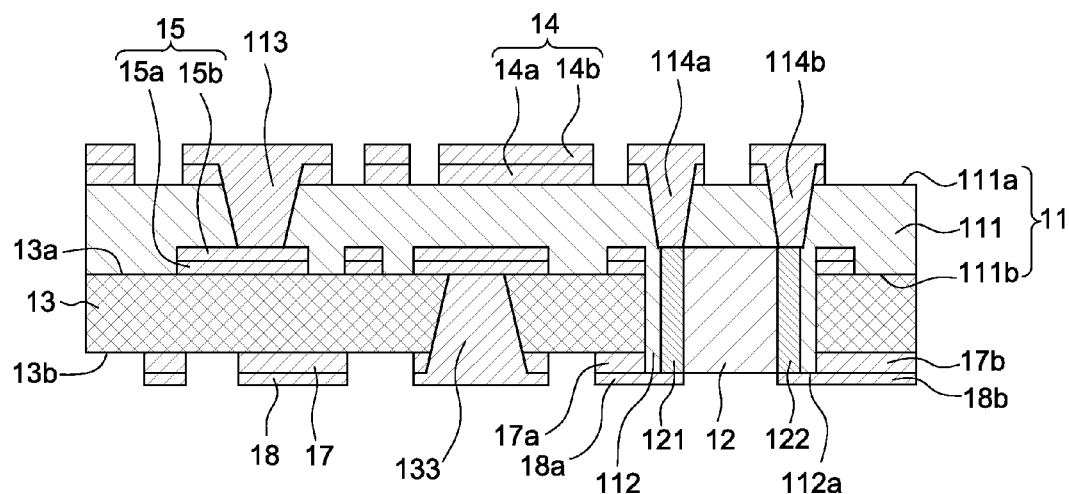

Referring to FIG. 4I, the patterned masks 14m and 18m are removed. A solder resist layer (e.g., solder resist layer 19a shown in FIG. 3A, not shown in FIG. 4I) may be formed on the lower surface 13b of the dielectric layer 13, and a solder resist layer (e.g, solder resist layer 19b shown in FIG. 3a, not shown in FIG. 4I) may be formed on the upper surface 111a of the body portion 111 of the dielectric layer 11 to form the semiconductor package structure 3 as shown in FIG. 3A. When formed, the solder resist layer 19a covers the electronic component 12 and the patterned conductive layers 17 and 18. When formed, the solder resist layer 19b covers the patterned conductive layers 14a and 14b and the upper surface 111a of the dielectric layer 11.

FIG. 4A, FIG. 4B, FIG. 4C, FIG. 4D, FIG. 4E, FIG. 4F, FIG. 4G, FIG. 4J and FIG. 4K illustrate a semiconductor process in accordance with another embodiment of the present disclosure.

The process as illustrated with reference to FIG. 4A, FIG. 4B, FIG. 4C, FIG. 4D, FIG. 4E, FIG. 4F and FIG. 4G may be referred to the above paragraphs and is not repeated here.

Figure 4J:
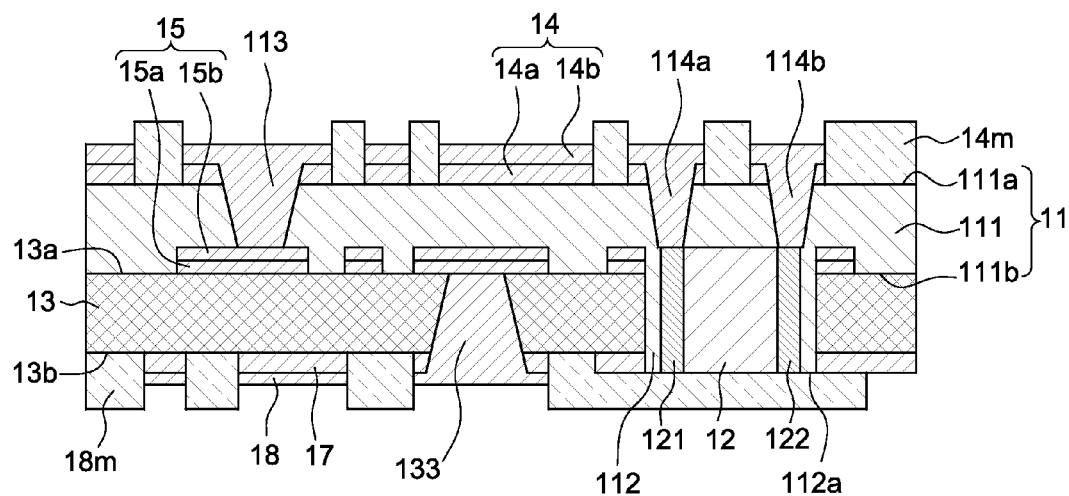
FIG. 4J and FIG. 4K illustrate a manufacturing method in accordance with another embodiment of the present disclosure.

Referring to FIG. 4J, the step as shown in 4J is similar to the step as described and illustrated with reference to FIG. 4H, except that the end 112a of the wall portion 112 and the electronic component 12 are further covered by the mask 18m.

Figure 4K:
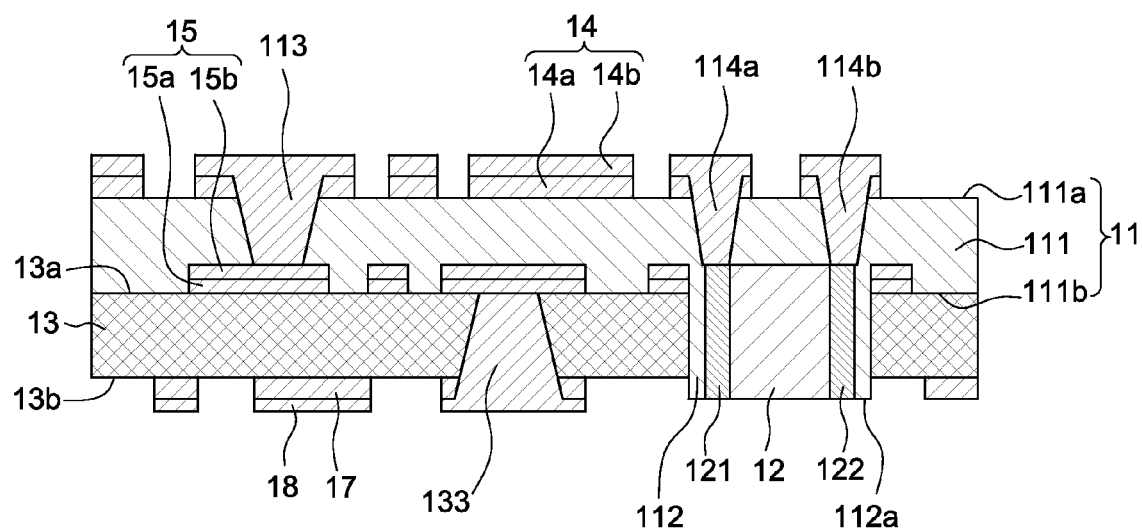

Referring to FIG. 4K, the step as shown in 4K is similar to the step as described and illustrated with reference to FIG. 4I. A solder resist layer (e.g., solder resist layer 19a shown in FIG. 3B, not shown in FIG. 4K) may be formed on the lower surface 13b of the dielectric layer 13, and a solder resist layer (e.g., solder resist layer 19b shown in FIG. 3B, not shown in FIG. 4K) may be formed on the upper surface 111a of the body portion 111 of the dielectric layer 11 to form the semiconductor package structure 4 as shown in FIG. 3B. When formed, the solder resist layer 19a covers the electronic component 12, the patterned conductive layers 17 and 18, and the lower surface 13b of the dielectric layer 13. When formed, the solder resist layer 19b covers the patterned conductive layers 14a and 14b and the upper surface 111a of the dielectric layer 11.

As used herein, the terms "substantially," "substantial," "approximately," and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

In some embodiments, two surfaces can be deemed to be coplanar or substantially coplanar if a displacement between the two surfaces is small, such as no greater than 1 μm, no greater than 5 μm, or no greater than 10 μm.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device substrate, comprising:
   a first dielectric layer comprising a body portion and a wall portion protruded from a first surface of the body portion, the wall portion having an end;
   a second dielectric layer having a first surface and an opposing second surface, the first surface of the second dielectric layer being adjacent to the first surface of the body portion, the second dielectric layer surrounding the wall portion, the end of the wall portion extending beyond the second surface of the second dielectric layer;
   an electronic component comprising a first electrical contact and a second electrical contact, at least a part of the electronic component being surrounded by the wall portion;
   a first patterned conductive layer embedded in the second surface of the second dielectric layer; and
   a second patterned conductive layer disposed on the second surface of the second dielectric layer and an exposed surface of the first patterned conductive layer, wherein the second patterned conductive layer is aligned with the first electrical contact, the second electrical contact and the end of the wall portion.

2. The semiconductor device substrate of claim 1, wherein the second patterned conductive layer electrically connects the first patterned conductive layer to the electronic component.

3. The semiconductor device substrate of claim 2, further comprising:
   a third patterned conductive layer disposed on a second surface of the body portion, the second surface of the body portion being opposite to the first surface of the body portion; and
   a fourth patterned conductive layer disposed on the first surface of the second dielectric layer and embedded in the body portion.

4. The semiconductor device substrate of claim 3, further comprising:
   at least one first via disposed in the first dielectric layer, the at least one first via electrically connecting the third patterned conductive layer to the fourth patterned conductive layer;
   at least one second via disposed in the second dielectric layer, the at least one second via electrically connecting the fourth patterned conductive layer to the first patterned conductive layer; and
   at least one third via disposed in the first dielectric layer, the at least one third via electrically connecting the third patterned conductive layer to the electronic component.

5. The semiconductor device substrate of claim 1, further comprising a third patterned conductive layer disposed on the first surface of the second dielectric layer and embedded in the body portion, wherein a part of the third patterned conductive layer surrounds the wall portion.

6. The semiconductor device substrate of claim 5, wherein the part of the third patterned conductive layer that surrounds the wall portion has an inner surface in contact with an outer surface of the wall portion.

7. A method of making a semiconductor device substrate comprising:
   (a) providing a first dielectric layer, a first patterned conductive layer, and a metal layer, the first dielectric layer having a first surface and an opposing second surface, the first patterned conductive layer disposed on the first surface, and the metal layer disposed on the second surface;
   (b) removing a part of the first dielectric layer and a part of the metal layer, to form an accommodation space;
   (c) attaching a support member to the metal layer;
   (d) placing an electronic component in the accommodation space and on the support member;
   (e) laminating a second dielectric layer to the first surface of the first dielectric layer to envelop the electronic component; and
   (f) removing the support member from the metal layer subsequent to the lamination of (e) to expose the electronic component.

8. The method of claim 7 further comprising: forming a second patterned conductive layer in (a), the second patterned conductive layer being adjacent to the second surface of the first dielectric layer.

9. The method of claim 8 further comprising: forming a conductor on the metal layer and on the second dielectric layer, the conductor configured to provide an electrical connection between the second patterned conductive layer and the electronic component.

10. The method of claim 8, wherein the forming the second patterned conductive layer comprises:
    providing a carrier;
    forming the metal layer on the carrier;
    forming the second patterned conductive layer on the metal layer; and
    forming the first dielectric layer on the second patterned conductive layer such that the first dielectric layer embeds the second patterned conductive layer.

11. The method of claim 8 further comprising: forming a third patterned conductive layer on the second dielectric layer.

12. The method of claim 11 further comprising: electrically connecting the first patterned conductive layer, the second patterned conductive layer and the third patterned conductive layer.

13. A circuit board, comprising:
    a base layer having a first surface and an opposing second surface, the base layer defining an opening from the first surface to the second surface;
    a component disposed within the opening defined by the base layer, wherein the component fills a portion of the opening such that a gap is defined between the component and the base layer, the component comprising an electrical contact;
    an insulating layer disposed on the first surface of the base layer, the insulating layer including a wall portion filling the gap defined between the component and the base layer;
    a first patterned conductive layer within the base layer and exposed from the second surface of the base layer; and
    a conductor disposed on the electrical contact and on the first patterned conductive layer, wherein the conductor is configured to form an electrical connection between the electrical contact and the first patterned conductive layer.

14. The circuit board of claim 13, wherein the wall portion of the insulating layer protrudes from the second surface of the base layer.

15. The circuit board of claim 13, wherein the component protrudes from the second surface of the base layer.

16. The circuit board of claim 13, further comprising a second patterned conductive layer on the first surface of the base layer, wherein the second patterned conductive layer electrically connects to the first patterned conductive layer.

17. The circuit board of claim 16, the second patterned conductive layer further comprising a ring surrounding the opening of the base layer, wherein the ring is electrically isolated from the first patterned conductive layer.

18. The circuit board of claim 17, wherein an inner surface of the ring is in contact with an outer surface of the wall portion of the insulating layer.

19. The circuit board of claim 16 further comprising a third patterned conductive layer on the insulating layer, wherein the third patterned conductive layer electrically connects to the second patterned conductive layer.

20. The circuit board of claim 13, wherein the conductor is further disposed on the wall portion of the insulating layer.

* * * * *